United States Patent
Tago et al.

(10) Patent No.: US 9,974,185 B2
(45) Date of Patent: May 15, 2018

(54) COMPONENT-EMBEDDED SUBSTRATE

(71) Applicant: Murata Manufacturing Co., Ltd., Kyoto (JP)

(72) Inventors: Shigeru Tago, Kyoto (JP); Hirofumi Shinagawa, Kyoto (JP); Yuki Wakabayashi, Kyoto (JP); Kuniaki Yosui, Kyoto (JP); Yuki Ito, Kyoto (JP); Toshiro Adachi, Kyoto (JP); Wataru Yanase, Kyoto (JP); Masaki Kawata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 157 days.

(21) Appl. No.: 15/015,475

(22) Filed: Feb. 4, 2016

(65) Prior Publication Data

US 2016/0157354 A1 Jun. 2, 2016

Related U.S. Application Data

(63) Continuation of application No. PCT/JP2015/053468, filed on Feb. 9, 2015.

(30) Foreign Application Priority Data

Apr. 10, 2014 (JP) ................................ 2014-081192
Dec. 26, 2014 (JP) ................................ 2014-263755

(51) Int. Cl.
*H05K 1/18* (2006.01)
*H05K 1/02* (2006.01)
*H05K 3/46* (2006.01)

(52) U.S. Cl.
CPC ........... *H05K 1/185* (2013.01); *H05K 1/0298* (2013.01); *H05K 1/186* (2013.01); *H05K 3/4682* (2013.01);
(Continued)

(58) Field of Classification Search
CPC ..... H05K 1/18; H05K 1/186; H01L 23/49836
(Continued)

(56) References Cited

U.S. PATENT DOCUMENTS 8,168,893 B2 * 5/2012 Ito .................... H01L 23/49838
174/260
2008/0136013 A1 * 6/2008 Kamiya ................ H05K 1/186
257/700
(Continued)

FOREIGN PATENT DOCUMENTS

JP 2006-210870 A 8/2006
JP 2008-147254 A 6/2008
(Continued)

OTHER PUBLICATIONS

Written Opinion of the International Searching Authority for Application No. PCT/JP2015/053468 dated May 19, 2015.
(Continued)

*Primary Examiner* — Tuan T Dinh
(74) *Attorney, Agent, or Firm* — Pearne & Gordon LLP

(57) ABSTRACT

A component-embedded substrate includes a laminate and an electronic component. The electronic component is embedded in the laminate. The laminate includes a frame-shaped conductor pattern. When the laminate is viewed in a laminating direction, the frame-shaped conductor pattern is arranged so as to substantially surround the entire periphery of the electronic component. The frame-shaped conductor pattern includes a first individual conductor pattern and a second individual conductor pattern. The first individual conductor pattern and the second individual conductor pattern are separated from each other. The first individual conductor pattern is arranged close to a first external terminal electrode of the electronic component, and the second
(Continued)

individual conductor pattern is arranged close to a second external terminal electrode of the electronic component.

18 Claims, 9 Drawing Sheets

(52) U.S. Cl.
CPC .............. *H05K 2201/09072* (2013.01); *H05K 2203/0278* (2013.01)

(58) Field of Classification Search
USPC .......................... 361/760–778; 174/259–264
See application file for complete search history.

(56) References Cited

U.S. PATENT DOCUMENTS

| | | | |
|---|---|---|---|
| 2010/0212152 A1* | 8/2010 | Chikagawa | ............ H05K 1/186 29/841 |
| 2013/0213699 A1 | 8/2013 | Chisaka | |
| 2014/0029222 A1* | 1/2014 | Saito | ...................... H05K 1/186 361/762 |

FOREIGN PATENT DOCUMENTS

| | | |
|---|---|---|
| JP | 2013-055109 A | 3/2013 |
| WO | 2012046829 A1 | 4/2012 |

OTHER PUBLICATIONS

International Search report for Application No. PCT/JP2015/053468 dated May 19, 2015.

* cited by examiner

COMPONENT-EMBEDDED SUBSTRATE

TECHNICAL FIELD

The present disclosure relates to a component-embedded substrate in which an electronic component is embedded.

BACKGROUND

Conventionally, as disclosed in International Publication No. 2012/046829, a configuration in which a mounting type electronic component is embedded in a laminate obtained by laminating insulating layers has been variously devised.

Such a conventional component-embedded substrate includes a laminate. When the laminate is viewed in a plan view, an electronic component is embedded substantially in the center of the laminate. The electronic component includes a rectangular parallelepiped-shaped main body, and a first external terminal electrode and a second external terminal electrode that are formed on the opposite end surfaces (side surfaces) of the main body, respectively. In the laminate, when the laminate is viewed in a plan view, a frame-shaped electrode is arranged so as to surround the electronic component. The frame-shaped electrode is arranged around the entire periphery of the electronic component. The frame-shaped electrode is arranged so as to be separated from the electronic component at a predetermined distance.

When the laminate is formed by thermocompression bonding a plurality of insulating layers made of thermoplastic resin in a state in which the electronic component is embedded, the conventional configuration can reduce or prevent the position of the electronic component from shifting from a desired position with the flow of the thermoplastic resin. However, the electronic component may slightly move at the time of thermocompression bonding in some cases. In such cases, if both the first external terminal electrode and the second external terminal electrode are connected to the frame-shaped electrode, the first external terminal electrode and the second external terminal electrode are short circuited. When such a short circuit occurs, the component-embedded substrate cannot obtain desired electrical characteristics.

In order to significantly reduce or prevent the short circuit between the frame-shaped electrode and the first and second external terminal electrodes due to movement of the electronic component, a distance between the frame-shaped electrode and the electronic component may be increased.

However, when the distance between the electronic component and the frame-shaped electrode is increased, the amount of thermoplastic resin between the electronic component and the frame-shaped electrode is increased, so that the range of the movement of the electronic component due to the flow of the thermoplastic resin is increased. This causes a possibility that the position of the electronic component can significantly shift from a desired position. In such a case, the electronic component can shift to a state of being connected to the electronic component, and then be embedded and fixed in the laminate in that state. When such a positional shift occurs, the frame-shaped electrode cannot obtain the original advantageous effects, and the component-embedded substrate cannot also obtain desired electrical characteristics.

SUMMARY

In view of the foregoing, embodiments of the present disclosure provide a laminate structure capable of easily forming a component-embedded substrate having desired electrical characteristics while significantly reducing or preventing the positional shift of an electronic component.

The present disclosure relates to a component-embedded substrate including an electronic component and a laminate. The electronic component includes a plurality of external terminal electrodes. The laminate is obtained by stacking a plurality of insulating layers each of which is made of thermoplastic resin. The laminate is obtained by thermocompression bonding the plurality of insulating layers in which the electronic component is arranged. The component-embedded substrate according to an embodiment of the present disclosure includes a frame-shaped conductor pattern provided so as to substantially surround the outer periphery of the electronic component when the laminate is viewed in a laminating direction. The frame-shaped conductor pattern in the component-embedded substrate includes a plurality of individual conductor patterns, each of which corresponds to each of the external terminal electrodes. Each of the individual conductor patterns in the component-embedded substrate is arranged close to a corresponding external terminal electrode.

With this configuration, even when each of the individual conductor patterns defining the frame-shaped conductor pattern contacts or is positioned close to the corresponding external terminal electrode, degradation and variation of characteristics due to the short circuit between the external terminal electrodes and the capacitive coupling through the individual conductor pattern hardly occur. Thus, the frame-shaped conductor pattern can be arranged closer to the electronic component. Accordingly, the movement of the electronic component due to the flow of thermoplastic resin can be further significantly reduced or prevented.

Additionally, in a component-embedded substrate according to an embodiment of the present disclosure, each of the individual conductor patterns may be connected to the corresponding external terminal electrode through a connection conductor. This configuration enables the frame-shaped conductor pattern and the external terminal electrode that are arranged close to the frame-shaped conductor pattern to be maintained at the same electric potential and can further significantly reduce or prevent the degradation of characteristics due to the arrangement of the frame-shaped conductor pattern. In addition, the positional relationship between the frame-shaped conductor pattern and the electronic component can be fixed and the movement of the electronic component due to the flow of thermoplastic resin constituting the insulating layers can be further significantly reduced or prevented.

Moreover, the component-embedded substrate according to an embodiment of the present disclosure is configured as follows. The frame-shaped conductor pattern may be arranged on the plurality of insulating layers in the laminating direction. The frame-shaped conductor pattern on at least one of the plurality of insulating layers may be arranged in a range in which the electronic component is arranged in the laminating direction.

This configuration can further significantly reduce or prevent the movement of the electronic component due to the flow of thermoplastic resin.

Furthermore, the component-embedded substrate according to an embodiment of the present disclosure is configured as follows. The electronic component may include a plurality of electronic components that are arranged in the laminate. The plurality of electronic components may be arranged at the substantially same position in the laminating direction. The individual conductor patterns corresponding to the plurality of external terminal electrodes having the same electric potential in the plurality of electronic components may be integrated.

With this configuration, even when the component-embedded substrate includes a plurality of electronic components that are embedded in the laminate, the degradation and variation of the characteristics of the component-embedded substrate due to the short circuit between the external terminal electrodes can be significantly reduced or prevented. In addition, since the individual conductor patterns are integrated, the size of a region in which an integrated individual conductor pattern is arranged can be smaller than the size of a region in which the individual conductor pattern is arranged for each electronic component. Thus, a smaller component-embedded substrate can be achieved.

Moreover, the component-embedded substrate according to an embodiment of the present disclosure is configured as follows. The individual conductor patterns may include a first individual conductor pattern and a second individual conductor pattern. The plurality of external terminal electrodes may include a first external terminal electrode and a second external terminal electrode. The first individual conductor pattern may be arranged close to the first external terminal electrode, the second individual conductor pattern may be arranged close to the second external terminal electrode, and the first individual conductor pattern and the second individual conductor pattern may be arranged through a gap in a direction in which the first external terminal electrode and the second external terminal electrode are aligned. The gap may include a plurality of gaps that are provided in an array direction in which the plurality of electronic components are arrayed. At least one of the plurality of gaps may be arranged at a position different from the positions of other gaps among the plurality of gaps in the direction in which the first external terminal electrode and the second external terminal electrode are aligned.

With this configuration, since the positions of the gaps are not aligned in a line, the flow of resin can be further significantly reduced or prevented.

Furthermore, the component-embedded substrate according to an embodiment of the present disclosure is configured as follows. The plurality of insulating layers each may include the first individual conductor pattern, the second individual conductor pattern, and the gap. At least one of the gaps that are arranged close to the array direction of the electronic components and the laminating direction may be arranged at a position different from the positions of other gaps in the direction in which the first external terminal electrode and the second external terminal electrode are aligned.

With this configuration, since the plurality of insulating layers each include the individual conductor patterns and the positions of the gaps are different from each other, the flow of resin can be further significantly reduced or prevented.

According to various embodiments of the present disclosure, a component-embedded substrate capable of achieving desired electrical characteristics can be easily achieved.

The above and other elements, features, steps, characteristics and advantages of the present disclosure will become more apparent from the following detailed description of the embodiments with reference to the attached drawings.

DETAILED DESCRIPTION

Figure 1:
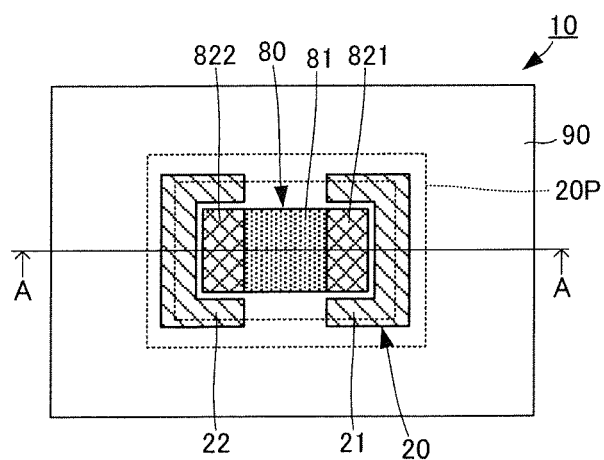
FIG. 1 is a plan view showing a structure of a component-embedded substrate according to a first embodiment of the present disclosure.
Figure 2:
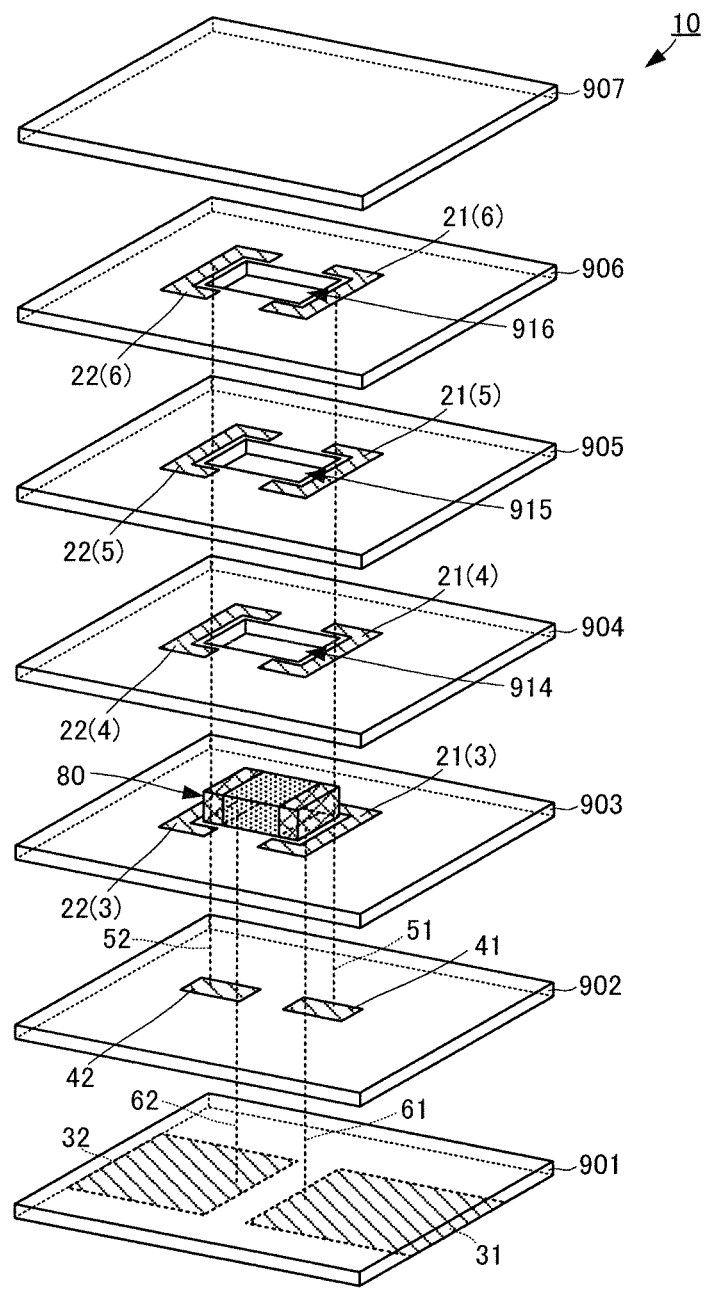
FIG. 2 is an exploded perspective view of the component-embedded substrate according to the first embodiment of the present disclosure.
Figure 3:
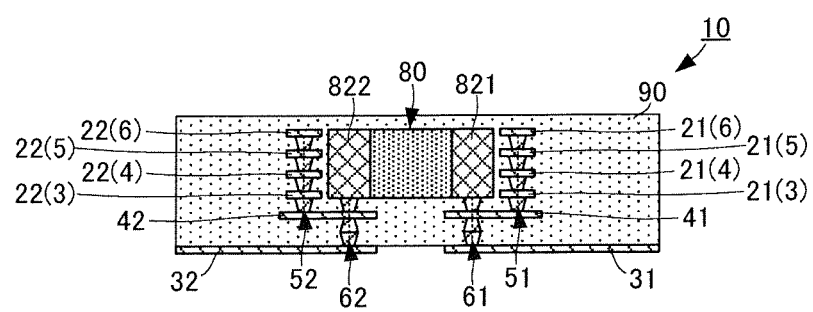
FIG. 3 is a side sectional view of the component-embedded substrate according to the first embodiment of the present disclosure.

A component-embedded substrate according to a first embodiment of the present disclosure will be described with reference to the drawings. FIG. 1 is a plan view showing a structure of the component-embedded substrate according to the first embodiment. FIG. 2 is an exploded perspective view of the component-embedded substrate according to the first embodiment. FIG. 3 is a side sectional view of the component-embedded substrate according to the first embodiment.

The component-embedded substrate 10 according to the first embodiment, as shown in FIG. 1 and FIG. 2, includes a laminate 90 obtained by stacking a plurality of insulating layers 901 to 907 in a laminating direction. The laminating direction shown in FIG. 2 is a vertical direction, though other non-vertical directions are possible in other embodiments. Each of the insulating layers 901 to 907 is made of thermoplastic resin and, more specifically, is made of a material mainly composed of a liquid crystal polymer, for example.

The laminate 90 includes an electronic component 80 that is embedded in the laminate. As shown in FIG. 1, when the laminate 90 is viewed in the laminating direction (viewed in a plan view), the electronic component 80 is arranged substantially in the center of the laminate 90. The electronic component 80, as shown in FIG. 3, is arranged at an intermediate position in the laminating direction in the laminate 90. In other words, the electronic component 80 is arranged inside the laminate 90.

The electronic component 80 includes a rectangular parallelepiped-shaped main body 81, a first external terminal electrode 821, and a second external terminal electrode 822. The main body 81 includes a first end and a second end, the first external terminal electrode 821 being arranged at the first end, and the second external terminal electrode 822 being arranged at the second end. The electronic component 80 is embedded in the laminate 90 so that the direction in which the first external terminal electrode 821 and the second external terminal electrode 822 are arrayed is perpendicular to the laminating direction.

As shown in FIG. 1 and FIG. 2, the laminate 90, when viewed in the laminating direction, includes a frame-shaped conductor pattern 20 that is arranged so as to substantially surround the entire periphery of the electronic component 80. The frame-shaped conductor pattern 20 includes a first individual conductor pattern 21 and a second individual conductor pattern 22. The first individual conductor pattern 21 and the second individual conductor pattern 22 are electrically separated from each other.

The first individual conductor pattern 21 is arranged close (i.e., adjacent) to the first external terminal electrode 821 of the electronic component 80. More specifically, as shown in FIG. 1 and FIG. 2, when the laminate 90 is viewed in the laminating direction, the first individual conductor pattern 21 is arranged close to three outer faces of the first external terminal electrode 821 of the electronic component 80, the three outer faces being in parallel to the laminating direction of the laminate 90.

The second individual conductor pattern 22 is arranged close (i.e., adjacent) to the second external terminal electrode 822 of the electronic component 80. More specifically, as shown in FIG. 1 and FIG. 2, when the laminate 90 is viewed in the laminating direction, the second individual conductor pattern 22 is arranged close to three outer faces of the second external terminal electrode 822 of the electronic component 80, the three outer faces being in parallel to the laminating direction of the laminate 90.

In the present embodiment, when the laminate 90 is viewed in the laminating direction, a distance between the first individual conductor pattern 21 and the second individual conductor pattern 22 is substantially equal to a distance between the first external terminal electrode 821 and the second external terminal electrode 822 of the electronic component 80. However, the distance between the first individual conductor pattern 21 and the second individual conductor pattern 22 is not limited to this embodiment. The first individual conductor pattern 21 and the second individual conductor pattern 22 that are on the same layer can be arranged so that the first individual conductor pattern 21 is closer to the first external terminal electrode 821 than to the second individual conductor pattern 22 and that the second individual conductor pattern 22 is closer to the second external terminal electrode 822 than to the first individual conductor pattern 21.

The first individual conductor pattern 21 and the second individual conductor pattern 22 that define the frame-shaped conductor pattern 20, as shown in FIG. 2 and FIG. 3, are arranged on a plurality of layers in the laminating direction of the laminate 90. More specifically, in the example as shown in FIG. 2 and FIG. 3, the laminate 90 includes insulating layers 901 to 907 that are stacked in order from the bottom from layer 901 to layer 907. The laminate 90 includes a first individual conductor pattern 21(3) and a second individual conductor pattern 22(3) between the insulating layers 903 and 904. The laminate 90 includes a first individual conductor pattern 21(4) and a second individual conductor pattern 22(4) between the insulating layers 904 and 905. The laminate 90 includes a first individual conductor pattern 21(5) and a second individual conductor pattern 22(5) between the insulating layers 905 and 906. The laminate 90 includes a first individual conductor pattern 21(6) and a second individual conductor pattern 22(6) between the insulating layers 906 and 907.

The first individual conductor patterns 21(3), 21(4), 21(5), and 21(6) have the substantially same shape and, when viewed from the laminating direction of the laminate 90, are arranged so as to be overlapped with each other substantially as a whole.

The second individual conductor patterns 22(3), 22(4), 22(5), and 22(6) have the substantially same shape and, when viewed from the laminating direction of the laminate 90, are arranged so as to be overlapped with each other substantially as a whole.

The first individual conductor patterns 21(3), 21(4), 21(5), and 21(6) and the second individual conductor patterns 22(3), 22(4), 22(5), and 22(6), as shown in FIG. 2 and FIG. 3, in the laminating direction of the laminate 90, are arranged in a region in which the electronic component 80 is arranged.

As shown in FIG. 2 and FIG. 3, the first individual conductor patterns 21(3), 21(4), 21(5), and 21(6) are connected by an interlayer connection conductor 51. The first individual conductor patterns 21(3), 21(4), 21(5), and 21(6) are connected by an interlayer connection conductor 51 to a routing conductor pattern 41 that is arranged between the insulating layers 902 and 903. The insulating layers 902 and 903 are positioned closer to the bottom of the laminate 90 than to the first individual conductor patterns 21(3), 21(4), 21(5), and 21(6). The routing conductor pattern 41 is connected to the first external terminal electrode 821 of the electronic component 80 by an interlayer connection conductor 61, which is connected to an external connection conductor 31 arranged on the bottom of the laminate 90.

As shown in FIG. 2 and FIG. 3, the second individual conductor patterns 22(3), 22(4), 22(5), and 22(6) are connected by an interlayer connection conductor 52. The second individual conductor patterns 22(3), 22(4), 22(5), and 22(6) are connected by an interlayer connection conductor 52 to a routing conductor pattern 42 that is arranged between the insulating layers 902 and 903. The insulating layers 902 and 903 are positioned closer to the bottom of the laminate 90 than to the second individual conductor patterns 22(3), 22(4), 22(5), and 22(6). The routing conductor pattern 42 is connected to the second external terminal electrode 822 of the electronic component 80 by an interlayer connection conductor 62, which is connected to an external connection conductor 32 arranged on the bottom of the laminate 90.

Thus, with the configuration according to the present embodiment, the following functions and effects can be achieved. To begin with, the frame-shaped conductor pattern 20 is arranged so as to surround the electronic component 80, which can 1) significantly reduce or prevent the movement of the electronic component 80 due to the flow of thermoplastic resin when the insulating layers 901 to 907 are thermocompression bonded; and 2) reliably connect the first external terminal electrode 821 to the interlayer connection conductor 61 as well as the second external terminal electrode 822 to the interlayer connection conductor 62.

In the configuration according to the present embodiment, the frame-shaped conductor pattern 20 is separated between the individual conductor pattern 21 associated with the first external terminal electrode 821 and the individual conductor pattern 22 associated with the second external terminal electrode 822. Therefore, even when the electronic component 80 moves such that the first external terminal electrode 821 is connected to the first individual conductor pattern 21 and the second external terminal electrode 822 is connected to the second individual conductor pattern 22, the first external terminal electrode 821 and the second external terminal electrode 822 are not connected to each other. Thus, the degradation of the electrical characteristics of the component-embedded substrate 10 can be significantly reduced or prevented.

In addition, as described above, even when the first external terminal electrode 821 is connected to the first individual conductor pattern 21, and the second external terminal electrode 822 is connected to the second individual conductor pattern 22, no degradation of characteristics occurs. As such, the first individual conductor pattern 21 can be closer to the first external terminal electrode 821 and the second individual conductor pattern 22 can be closer to the second external terminal electrode 822. In other words, a distance between the frame-shaped conductor pattern 20 and the electronic component 80 can be smaller. Accordingly, the thermoplastic resin existing between the frame-shaped conductor pattern 20 and the electronic component 80 can be reduced. Thus, the movement of the electronic component 80 due to the flow of thermoplastic resin can be further reliably reduced or prevented.

For example, in comparison with conventional configurations, the distance between the frame-shaped conductor pattern 20 and the electronic component 80 can be made to be about one-tenth of the conventional distance (i.e., less than the conventional distance). More specifically, the conventional distance between the frame-shaped conductor pattern 20 and the electronic component 80 has needed to be about 200 μm, whereas the distance in the configuration described above can be made to be about 20 μm (i.e., less than about 200 μm). This can make the shape of the component-embedded substrate 10 further smaller. Alternatively, if the shape of the component-embedded substrate 10 is maintained, additional conductor patterns or circuit element patterns (inductors or capacitors by conductor patterns) can be provided in the component-embedded substrate 10.

Moreover, the first individual conductor pattern 21 and the second individual conductor pattern 22 are arranged on the plurality of insulating layers, which can further significantly reduce or prevent the movement of the electronic component 80. Furthermore, in the laminating direction, the electronic component 80, the first individual conductor pattern 21, and the second individual conductor pattern 22 can be arranged in the same region, which can further significantly reduce or prevent the flow of thermoplastic resin between the first individual conductor pattern 21, the second individual conductor pattern 22, and the electronic component 80 and can further significantly reduce or prevent the movement of the electronic component 80. It should be noted that, in the present embodiment, the first individual conductor pattern 21 and the second individual conductor pattern 22 of all the insulating layers in the laminating direction are arranged in the same region as the electronic component 80. When the first individual conductor pattern 21 and the second individual conductor pattern 22 of at least one insulating layer in the laminating direction are arranged in the same region as the electronic component 80, a large amount of the above-described functions and effects can be achieved. In this regard, when the first individual conductor pattern 21 and the second individual conductor pattern 22 of all the insulating layers in the laminating direction are arranged in the same region as the electronic component 80, the functions and effects of the present embodiment can be more effectively achieved.

In addition, the first individual conductor pattern 21 arranged on the plurality of insulating layers is connected by the interlayer connection conductor 51 and the second individual conductor pattern 22 arranged on the plurality of insulating layers is connected by the interlayer connection conductor 52. This significantly reduces or prevents the movement of the first individual conductor pattern 21 and the second individual conductor pattern 22 arranged on the plurality of insulating layers. This can further significantly reduce or prevent the movement of the electronic component 80 and can further significantly reduce or prevent the contact between the first individual conductor pattern 21 and the second individual conductor pattern 22. In such a case, the interlayer connection conductor 51 connecting the first individual conductor pattern 21 may include a plurality of interlayer connection conductors so as to surround the first external terminal electrode 821. This configuration can 1) significantly reduce or prevent deformation and position variation of the first individual conductor pattern 21 due to the flow of thermoplastic resin, 2) prevent the first individual conductor pattern 21 from contacting the second individual conductor pattern 22 corresponding to the second external terminal electrode 822, and 3) further significantly reduce or prevent the flow of thermoplastic resin in a region covered with the first individual conductor pattern 21. Similarly, the interlayer connection conductor 52 connecting the second individual conductor pattern 22 may include a plurality of interlayer connection conductors so as to surround the second external terminal electrode 822. This configuration can 1) significantly reduce or prevent deformation and position variations in the second individual conductor pattern 22 due to the flow of thermoplastic resin, 2) prevent the second individual conductor pattern 22 from contacting the first individual conductor pattern 21 corresponding to the first external terminal electrode 821, and 3) significantly reduce or prevent the flow of thermoplastic resin in a region covered with the second individual conductor pattern 22.

In addition, the first individual conductor pattern 21 is connected to the first external terminal electrode 821, and the second individual conductor pattern 22 is connected to the second external terminal electrode 822. This configuration can 1) significantly reduce or prevent change in characteristics due to the arrangement of the first individual conductor pattern 21 and the second individual conductor pattern 22, and 2) significantly reduce or prevent change in characteristics due to whether or not the first external terminal electrode 821 is connected to the first individual conductor pattern 21 and whether or not the second external terminal electrode 822 is connected to the second individual conductor pattern 22. Accordingly, the degradation of the characteristics of the component-embedded substrate 10 can be more reliably reduced or prevented.

It is to be noted that, while the present embodiment shows the first individual conductor pattern 21 connected to the first external terminal electrode 821 and the second individual conductor pattern 22 connected to the second external terminal electrode 822, similar functions and effects can be achieved even when no connections between the individual conductor patterns and the external terminal electrodes are made. In addition, while the present embodiment shows an example wherein the first individual conductor pattern 21 and the second individual conductor pattern 22 are arranged on the plurality of insulating layers, at least one insulating layer can be sufficient. In a case of one layer, the first individual conductor pattern 21 and the second individual conductor pattern can be arranged in the same region the as the electronic component 80 in the laminating direction.

Such a component-embedded substrate 10 is manufactured as follows.

First, a plurality of double-sided copper-clad insulating films are prepared. The insulating films are made of thermoplastic resin.

Then, a patterning process is performed to each of the insulating films to form the frame-shaped conductor pattern 20, the external connection conductors 31 and 32, and the routing conductor patterns 41 and 42. Moreover, openings 914, 915, and 916, as shown in FIG. 2, are formed in predetermined insulating films. The frame-shaped conductor pattern 20 is arranged so as to surround the openings 914, 915, and 916 on each of the predetermined insulating films. The electronic component 80 is placed on the predetermined insulating films and then the plurality of insulating films are stacked. In such a case, the plurality of insulating films are stacked so that the electronic component 80 is placed into a cavity defined by the openings 914, 915, and 916.

Thus, a resulting laminate is thermocompression bonded and cut into pieces to obtain the component-embedded substrate 10.

Figure 4:
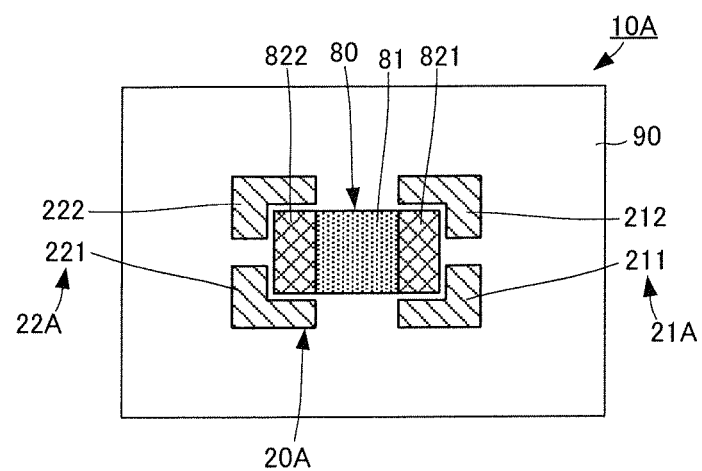
FIG. 4 is a plan view showing a structure of a component-embedded substrate according to a second embodiment of the present disclosure.

Next, a component-embedded substrate according to a second embodiment of the present disclosure will be described with reference to FIG. 4. FIG. 4 is a plan view showing a structure of the component-embedded substrate according to the second embodiment of the present disclosure.

A component-embedded substrate 10A according to the second embodiment includes a frame-shaped conductor pattern 20A having a configuration that is different from the configuration of the component-embedded substrate 10 according to the first embodiment. Other features of the component-embedded substrate 10A having the same reference numerals as features in the component-embedded substrate 10 according to the first embodiment are the same.

The frame-shaped conductor pattern 20A includes a first individual conductor pattern 21A and a second individual conductor pattern 22A. The first individual conductor pattern 21A includes piece patterns 211 and 212. The piece patterns 211 and 212 are arranged so as to surround the faces of the first external terminal electrode 821 that are parallel to the laminating direction and exposed to the outside. The piece patterns 211 and 212 are separated from each other.

The second individual conductor pattern 22A includes piece patterns 221 and 222. The piece patterns 221 and 222 are arranged so as to surround the faces of the second external terminal electrode 822 that are parallel to the laminating direction and exposed to the outside. The piece patterns 221 and 222 are separated from each other.

With such a configuration, functions and effects similar to the functions and effects of the component-embedded substrate 10 according to the first embodiment can be achieved.

In the component-embedded substrate 10A according to the second embodiment, when the laminate 90 is viewed in the laminating direction, the piece patterns 211, 212, 221, and 222 are arranged so as to surround the four corners of the electronic component 80. Such an arrangement of the piece patterns can significantly reduce or prevent the electronic component 80 from moving in both an array direction in which the external terminal electrodes are arrayed and a direction perpendicular to the array direction.

In addition, while not shown in FIG. 4, the piece patterns 211 and 212 defining the first individual conductor pattern 21A may or may not be electrically connected to other layers of the laminate 90 through the interlayer connection conductor 51 or the like and may be connected as described above. Similarly, while the piece patterns 221 and 222 defining the second individual conductor pattern 22A may or may not be electrically connected to the other layers of the laminate 90 through the interlayer connection conductor 52 or the like, the piece patterns 221 and 222 may be connected as described above.

Figure 5:
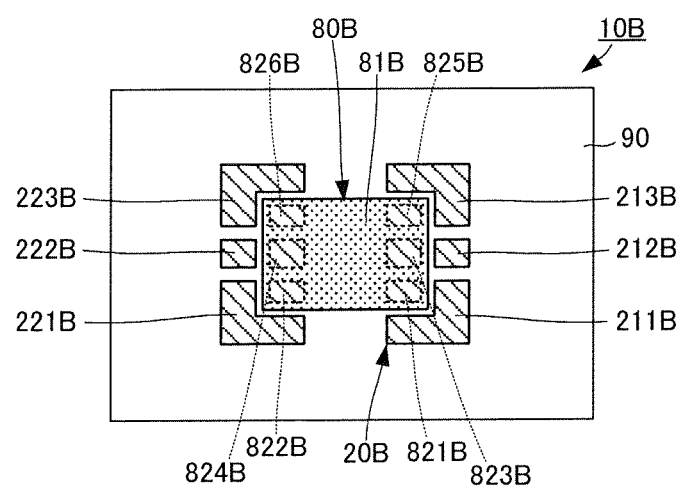
FIG. 5 is a plan view showing a structure of a component-embedded substrate according to a third embodiment of the present disclosure.

Next, a component-embedded substrate according to a third embodiment of the present disclosure will be described with reference to FIG. 5. FIG. 5 is a plan view showing a structure of the component-embedded substrate according to the third embodiment of the present disclosure.

While the above described embodiments show the component-embedded substrate including the electronic component wherein the external terminal electrodes are arranged on the end surfaces of the main body of the electronic component, the component-embedded substrate according to the third embodiment shows a case in which the external terminal electrodes of the electronic component are arrayed on the bottom of the main body of the electronic component.

A component-embedded substrate 10B includes an electronic component 80B, and a laminate 90 in which the electronic component 80B is embedded.

The electronic component 80B includes a plate-shaped main body 81B. External terminal electrodes 821B, 822B, 823B, 824B, 825B, and 826B are arranged on the bottom of the main body 81B.

The laminate 90 includes a frame-shaped conductor pattern 20B. The frame-shaped conductor pattern 20B, when the laminate 90 is viewed in the laminating direction, is arranged so as to surround the electronic component 80B. The frame-shaped conductor pattern 20B, in the laminating direction of the laminate 90, is arranged in the same region as the region in which the electronic component 80B is arranged.

The frame-shaped conductor pattern 20B includes individual conductor patterns 211B, 212B, 213B, 221B, 222B, and 223B that are separated from one another. The individual conductor pattern 211B is arranged close to and electrically connected to the external terminal electrode 821B. The individual conductor pattern 212B is arranged close to and electrically connected to the external terminal electrode 823B. The individual conductor pattern 213B is arranged close to and electrically connected to the external terminal electrode 825B. The individual conductor pattern 221B is arranged close to and electrically connected to the external terminal electrode 822B. The individual conductor pattern 222B is arranged close to and electrically connected to the external terminal electrode 824B. The individual conductor pattern 223B is arranged close to and electrically connected to the external terminal electrode 826B.

With such a configuration, functions and effects similar to the functions and effects of the above described first embodiment can be achieved.

Figure 6:
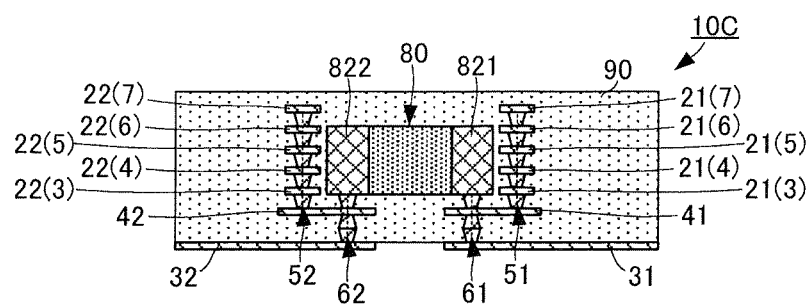
FIG. 6 is a side sectional view of a component-embedded substrate according to a fourth embodiment of the present disclosure.

Next, a component-embedded substrate according to a fourth embodiment of the present disclosure will be described with reference to FIG. 6. FIG. 6 is a side sectional view of the component-embedded substrate according to the fourth embodiment of the present disclosure.

A component-embedded substrate 10C according to the fourth embodiment includes a frame-shaped conductor pattern wherein the number of layers is different from the number of layers of the component-embedded substrate 10 according to the first embodiment. Features of the component-embedded substrate 10C having the same reference numerals as features in the component-embedded substrate 10 according to the first embodiment are the same.

The component-embedded substrate 10C according to the fourth embodiment includes five layers of the first individual conductor pattern 21 and five layers of the second individual conductor pattern 22. Thus, the frame-shaped conductor pattern, in the laminating direction of the laminate 90, is arranged in a region larger than the region in which the electronic component 80 is arranged.

Such a configuration can more reliably reduce or prevent the movement of the electronic component 80.

Figure 7:
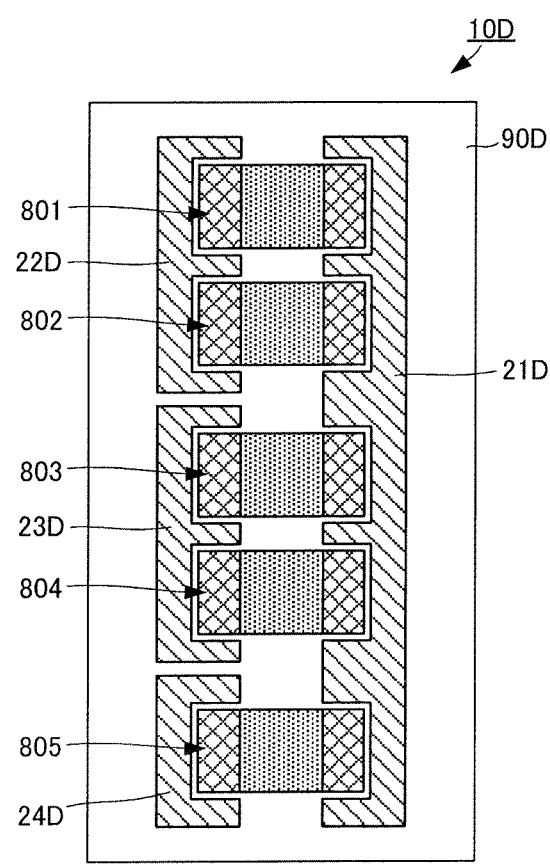
FIG. 7 is a plan view showing a structure of a component-embedded substrate according to a fifth embodiment of the present disclosure.

A component-embedded substrate according to a fifth embodiment of the present disclosure will now be described with reference to FIG. 7. FIG. 7 is a plan view showing a structure of the component-embedded substrate according to the fifth embodiment of the present disclosure.

A component-embedded substrate 10D according to the fifth embodiment includes a laminate 90D in which a plurality of electronic components 801, 802, 803, 804, and 805 are embedded. The component-embedded substrate 10D according to the present embodiment also includes a basic configuration similar to the configuration of the component-embedded substrate 10 according to the first embodiment. Thus, only the characterized portions of the fifth embodiment will be specifically described.

The electronic components 801, 802, 803, 804, and 805 are arrayed with a space between each other in a direction perpendicular to the array direction of their external terminal electrodes. In such a case, the electronic components 801, 802, 803, 804, and 805 are arranged so that each group of external terminal electrodes connected at the same electric potential (e.g., the group of external terminal electrodes for electronic components 801 and 802) is arrayed in a direction substantially parallel to the array direction of the electronic components 801, 802, 803, 804, and 805.

An individual conductor pattern 21D is arranged so as to surround a first group of external terminal electrodes connected at the same electric potential at the first ends of the electronic components 801, 802, 803, 804, and 805. In such a case, the individual conductor pattern 21D is defined by integrated conductor patterns, that is, a common conductor pattern, with respect to the electronic components 801, 802, 803, 804, and 805.

An individual conductor pattern 22D is arranged so as to surround a second group of external terminal electrodes connected at the same electric potential at the second ends of the electronic components 801 and 802. In such a case, the individual conductor pattern 22D is defined by a common and integrated conductor pattern with respect to the electronic components 801 and 802.

An individual conductor pattern 23D is arranged so as to surround a third group of external terminal electrodes connected at the same electric potential at the second ends of the electronic components 803 and 804. In such a case, the individual conductor pattern 23D is defined by a common and integrated conductor pattern with respect to the electronic components 803 and 804.

An individual conductor pattern 24D is arranged so as to surround the external terminal electrode at the second end of the electronic component 805.

With such a configuration, functions and effects similar to the functions and effects of the first embodiment can be achieved.

Moreover, with the configuration according to the fifth embodiment, since the individual conductor patterns that surround the groups of external terminal electrodes connected at the same electric potential are integrated, the total area of an integrated individual conductor pattern can be smaller than an area in which each of the individual conductor patterns are separately formed. This can make the component-embedded substrate 10D smaller. Furthermore, since a distance between adjacent electronic components can be smaller, the component-embedded substrate 10D can be further smaller. In addition, by integrating the individual conductor patterns to form one large individual conductor pattern, the individual conductor pattern becomes hard to move and the flow of resin in a region surrounded by the individual conductor pattern can be effectively reduced or prevented.

Figure 8:
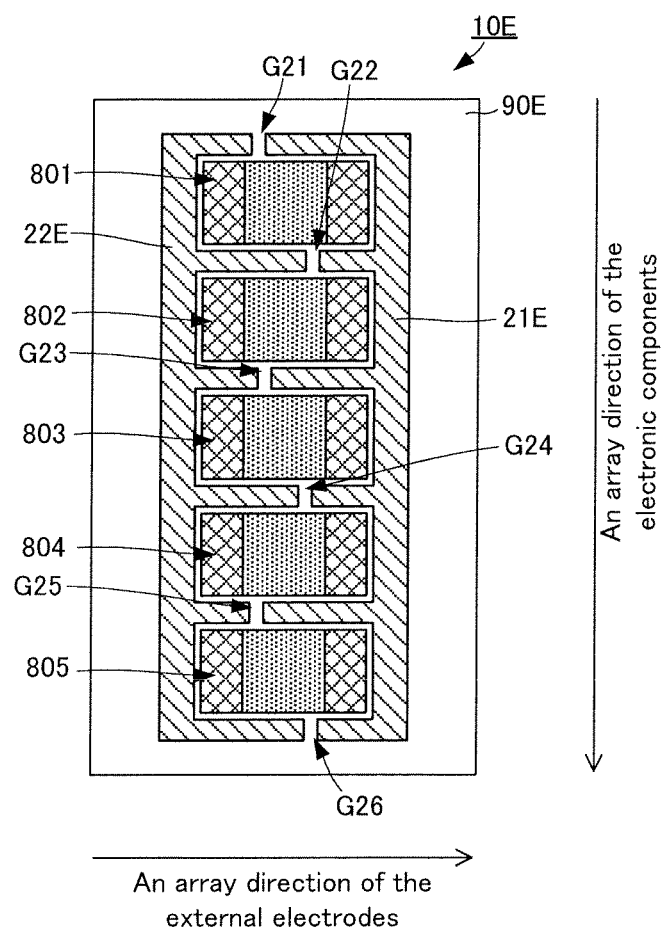
FIG. 8 is a plan view showing a structure of a component-embedded substrate according to a sixth embodiment of the present disclosure.

A component-embedded substrate according to a sixth embodiment of the present disclosure will be described with reference to FIG. 8. FIG. 8 is a plan view showing a structure of the component-embedded substrate according to the sixth embodiment of the present disclosure.

A component-embedded substrate 10E according to the sixth embodiment includes a laminate 90E and individual conductor patterns 21E and 22E of which the configurations are different from the configuration of the component-embedded substrate according to the fifth embodiment. Features of the component-embedded substrate 10E having the same reference numerals as features in the component-embedded substrate according to the fifth embodiment are the same. Thus, only the characterized portions of the sixth embodiment will be specifically described.

The component-embedded substrate 10E includes the individual conductor patterns 21E and 22E.

The individual conductor pattern 21E is arranged close to the external terminal electrodes at the first ends of the arrayed electronic components 801 to 805. The individual conductor pattern 21E is defined by an integration of a common conductor and a plurality of conductor fingers. The common conductor extends in the array direction of the electronic components 801 to 805 and the conductor fingers extend in a direction connecting the end surfaces of the electronic components 801 to 805. The conductor fingers are arranged so as to interpose each of the electronic components 801 to 805 in the array direction.

The individual conductor pattern 22E is arranged close to the external terminal electrodes at the second ends of the arrayed electronic components 801 to 805. The individual conductor pattern 22E is defined by an integration of a common conductor and a plurality of conductor fingers. The common conductor extends in the array direction of the electronic components 801 to 805 and the conductor fingers extend in a direction connecting the end surfaces of the electronic components 801 to 805. The conductor fingers are arranged so as to interpose each of the electronic components 801 to 805 in the array direction.

The conductor fingers of the individual conductor pattern 21E and the conductor fingers of the individual conductor pattern 22E are separated from each other with a predetermined gap. Specifically, the conductor fingers of the individual conductor pattern 21E and individual conductor pattern 22E in the electronic component 801 are arranged on the side of electronic component 801 opposite from the electronic component 802 and are separated from each other with a gap G21. The conductor fingers of the individual conductor pattern 21E and individual conductor pattern 22E are arranged between the electronic component 801 and the electronic component 802 and are separated from each other with a gap G22. The conductor fingers of the individual conductor pattern 21E and the individual conductor pattern 22E are arranged between the electronic component 802 and the electronic component 803 and are separated from each other with a gap G23. The conductor fingers of the individual conductor pattern 21E and the individual conductor pattern 22E are arranged between the electronic component 803 and the electronic component 804 and are separated from each other with a gap G24. The conductor fingers of the individual conductor pattern 21E and the individual conductor pattern 22E are arranged between the electronic component 804 and the electronic component 805 and are separated from each other with a gap G25. The conductor fingers of the individual conductor pattern 21E and the individual conductor pattern 22E in the electronic component 805 are arranged on the side of electronic component 805 opposite from the electronic component 804 and are separated from each other with a gap G26.

At least one of the gaps G21, G22, G23, G24, G25, and G26 is arranged at a position different from the positions of the other gaps in the direction connecting the end surfaces of the electronic components. Such a configuration can further significantly reduce or prevent the flow of resin in comparison with a mode in which the gaps G21, G22, G23, G24, G25, and G26 are at the same position in the direction connecting the end surfaces of the electronic components (i.e., a mode in which the gaps are aligned in a line).

It is to be noted that each of the gaps G21, G22, G23, G24, G25, and G26 is arranged at a different position in the direction connecting the end surfaces of the electronic components.

Figure 9:
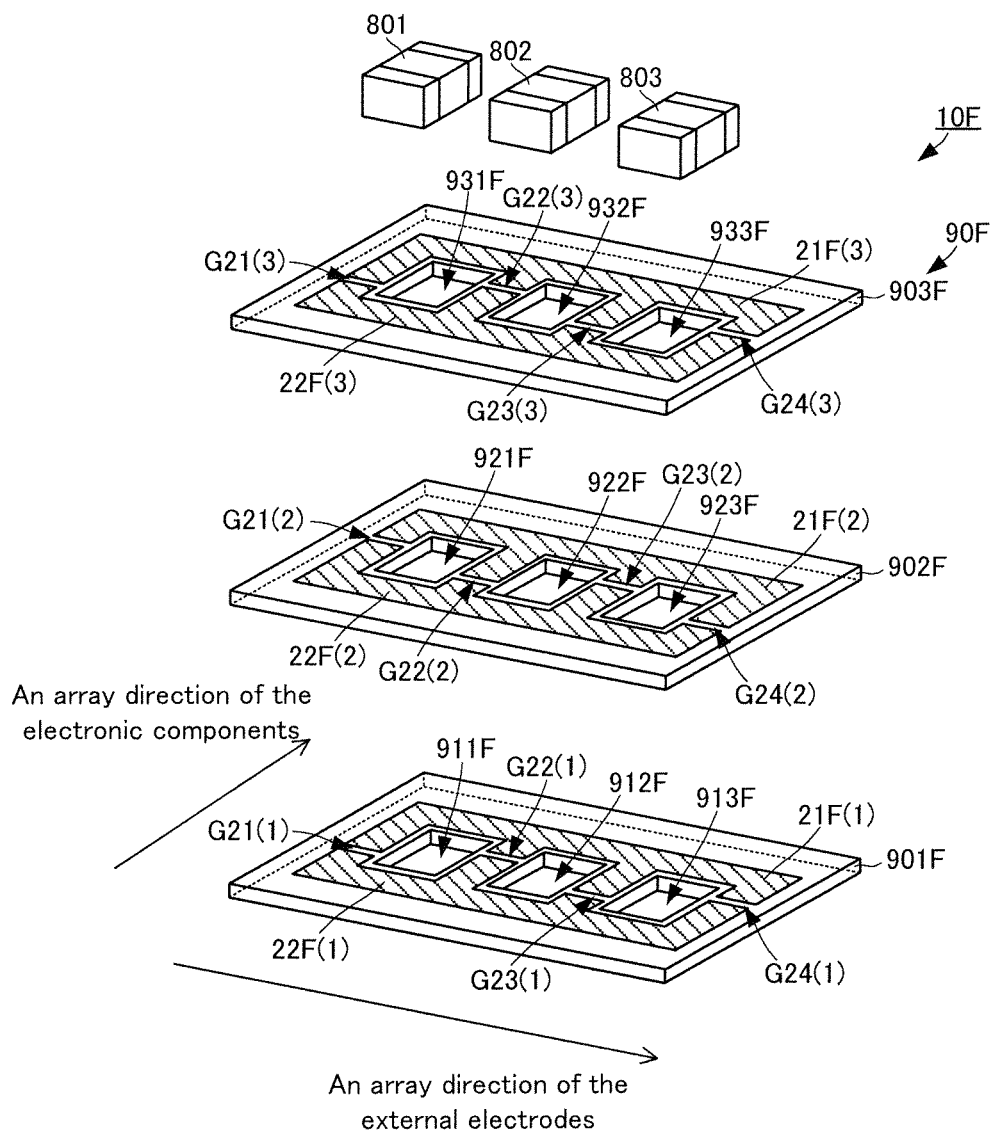
FIG. 9 is a partially exploded perspective view showing a structure of a component-embedded substrate according to a seventh embodiment of the present disclosure.

A component-embedded substrate according to a seventh embodiment of the present disclosure will be described with reference to FIG. 9. FIG. 9 is a partially exploded perspective view showing a structure of the component-embedded substrate according to the seventh embodiment of the present disclosure.

A component-embedded substrate 10F according to the seventh embodiment has a configuration in which a plurality of the layers each including the individual conductor patterns of the component-embedded substrate 10E according to the sixth embodiment are stacked. Features of the component-embedded substrate 10F having the same reference numerals as features in the component-embedded substrate 10E according to the sixth embodiment are the same. Thus, only the characterized portions of the present embodiment will be specifically described.

The component-embedded substrate 10F includes insulating layers 901F, 902F, and 903F that are stacked in the thickness direction.

The insulating layer 901F includes openings 911F, 912F, and 913F. The insulating layer 902F includes openings 921F, 922F, and 923F. The insulating layer 903F includes openings 931F, 932F, and 933F. The openings 911F, 921F, and 931F define a cavity in which the electronic component 801 is arranged. The openings 912F, 922F, and 932F define a cavity in which the electronic component 802 is arranged. The openings 913F, 923F, and 933F define a cavity in which the electronic component 803 is arranged. With this configuration, the electronic components 801, 802, and 803 are arranged in an array in one direction of a laminate 90F.

The insulating layer 901F includes individual conductor patterns 21F(1) and 22F(1). When the insulating layer 901F is viewed in the laminating direction, the individual conductor patterns 21F(1) and 22F(1) are arranged so as to surround the electronic components 801, 802, and 803. The individual conductor patterns 21F(1) and 22F(1) are arranged through gaps G21(1), G22(1), G23(1), and G24(1) in the direction in which the external terminal electrodes of the electronic component are aligned. At least one of the gaps G21(1), G22(1), G23(1), and G24(1) is arranged at a position different from the positions of the other gaps in the direction in which the external terminal electrodes of the electronic component are aligned.

The insulating layer 902F includes individual conductor patterns 21F(2) and 22F(2). The individual conductor patterns 21F(2) and 22F(2), when the insulating layer 902F is viewed in the laminating direction, are arranged so as to surround the electronic components 801, 802, and 803. The individual conductor patterns 21F(2) and 22F(2) are arranged through the gaps G21(2), G22(2), G23(2), and G24(2) in the direction in which the external terminal electrodes of the electronic components are aligned. At least one of the gaps G21(2), G22(2), G23(2), and G24(2) is arranged at a position different from the positions of the other gaps in the direction in which the external terminal electrodes of the electronic component are aligned.

The insulating layer 903F includes individual conductor patterns 21F(3) and 22F(3). When the insulating layer 903F is viewed in the laminating direction, the individual conductor patterns 21F(3) and 22F(3) are arranged so as to surround the electronic components 801, 802, and 803. The individual conductor patterns 21F(3) and 22F(3) are arranged through the gaps G21(3), G22(3), G23(3), and G24(3) in the direction in which the external terminal electrodes of the electronic components are aligned. At least one of the gaps G21(3), G22(3), G23(3), and G24(3) is arranged at a position different from the positions of the other gaps in the direction in which the external terminal electrodes of the electronic components are aligned.

Furthermore, at least one of the gaps G21(1), G21(2), and G21(3) is arranged at a position different from the positions of the other gaps in the direction in which the external terminal electrodes of the electronic components are aligned. In other words, at least one of the gaps G21(1), G21(2), and G21(3) that are close to the array direction of the electronic components and the laminating direction of the insulating layers is arranged at a position different from the positions of the other gaps in the direction in which the external terminal electrodes of the electronic components are aligned.

At least one of the gaps G23(1), G23(2), and G23(3) is arranged at a position different from the positions of the other gaps in the direction in which the external terminal electrodes of the electronic components are aligned. In other words, at least one of the gaps G23(1), G23(2), and G23(3) that are close to the array direction of the electronic components and the laminating direction of the insulating layers is arranged at a position different from the positions of the other gaps in the direction in which the external terminal electrodes of the electronic components are aligned.

At least one of the gaps G24(1), G24(2), and G24(3) is arranged at a position different from the positions of the other gaps in the direction in which the external terminal electrodes of the electronic components are aligned. In other words, at least one of the gaps G24(1), G24(2), and G24(3) that are close to the array direction of the electronic components and the laminating direction of the insulating layers is arranged at a position different from the positions of the other gaps in the direction in which the external terminal electrodes of the electronic components are aligned.

Such a configuration can further significantly reduce or prevent the flow of resin.

It should be noted that all the gaps may be arranged at different positions in the direction in which the external terminal electrodes of the electronic components are aligned, and such a configuration can further significantly reduce or prevent the flow of the resin.

Finally, the above described embodiments are to be considered in all respects as illustrative and not restrictive. The scope of the present disclosure is defined by the following claims, not by the foregoing embodiments. Further, the scope of the present disclosure is intended to include the scopes of the claims and all possible changes and modifications within the senses and scopes of equivalents.

What is claimed is:

1. A component-embedded substrate comprising:
   an electronic component including a plurality of external terminal electrodes;
   a laminate obtained by stacking a plurality of insulating layers and thermocompression bonding the plurality of insulating layers in a state in which the electronic component is arranged in the plurality of insulating layers, each of the plurality of insulating layers being made of thermoplastic resin; and a frame-shaped conductor pattern provided so as to substantially surround an outer periphery of the electronic component when the laminate is viewed in a laminating direction, wherein:

the frame-shaped conductor pattern includes a plurality of individual conductor patterns, each of the plurality of individual conductor patterns being arranged adjacent to a corresponding external terminal electrode of the plurality of external terminal electrodes, and at least one of the plurality of individual conductor patterns is arranged adjacent to a corner of the electronic component when viewed in the laminating direction;

wherein at least one of the plurality of individual conductor patterns extends along two connecting sides of the electronic component that define the corner, viewed in the laminating direction.

2. The component-embedded substrate according to claim 1, wherein each of the individual conductor patterns is connected to the corresponding external terminal electrode through a connection conductor.

3. The component-embedded substrate according to claim 1, wherein:

the frame-shaped conductor pattern is arranged on the plurality of insulating layers in the laminating direction; and the frame-shaped conductor pattern on at least one of the plurality of insulating layers is arranged in a range in which the electronic component is arranged in the laminating direction.

4. The component-embedded substrate according to claim 1, wherein:

the electronic component includes a plurality of electronic components arranged in the laminate;

the plurality of electronic components are arranged at a substantially same position in the laminating direction; and an integrated individual conductor pattern corresponds to a group of external terminal electrodes having a same electric potential in the plurality of electronic components.

5. The component-embedded substrate according to claim 1, wherein a distance between the frame-shaped conductor pattern and the electronic component is about 20 µm.

6. The component-embedded substrate according to claim 1, wherein:

the plurality of individual conductor patterns are arranged on the plurality of insulating layers;

two adjacent individual conductor patterns in the laminating direction are partially overlapped each other, viewed in the laminating direction; and the two adjacent individual conductor patterns are connected each other by an interlayer connection conductor.

7. The component-embedded substrate according to claim 1, wherein the plurality of individual conductor patterns are arranged in a region of the plurality of insulating layers including insulating layers attached to an upper surface and a bottom surface of the electronic component.

8. The component-embedded substrate according to claim 4, wherein:

the plurality of individual conductor patterns include a first individual conductor pattern and a second individual conductor pattern;

the plurality of external terminal electrodes include a first external terminal electrode and a second external terminal electrode;

the first individual conductor pattern is positioned closer to the first external terminal electrode than the second external electrode;

the second individual conductor pattern is positioned closer to the second external terminal electrode than the first external electrode;

the first individual conductor pattern and the second individual conductor pattern are arranged in a direction in which the first external terminal electrode and the second external terminal electrode are aligned, the first individual conductor pattern and the second individual conductor pattern being arranged such that a gap is formed therebetween;

the gap includes a plurality of gaps provided in an array direction in which the plurality of electronic components are arrayed; and at least one of the plurality of gaps is arranged at a position different from positions of other gaps among the plurality of gaps in the direction in which the first external terminal electrode and the second external terminal electrode are aligned.

9. The component-embedded substrate according to claim 8, wherein:

the plurality of insulating layers each include the first individual conductor pattern, the second individual conductor pattern, and the gap; and at least one of the gaps positioned adjacent to the array direction of the electronic components and the laminating direction is arranged at a position different from positions of other gaps in the direction in which the first external terminal electrode and the second external terminal electrode are aligned.

10. A component-embedded substrate comprising:

an electronic component including a first external terminal electrode and a second external terminal electrode; and a laminate obtained by stacking a plurality of layers and thermocompression bonding the plurality of layers in a state in which the electronic component is arranged in the plurality of layers, wherein the plurality of layers comprises a first layer and a second layer stacked together, the first layer and the second layer each comprising:

an insulating layer made of thermoplastic resin, and a first individual conductor pattern and a second individual conductor pattern provided on the insulating layer that form a frame-shaped conductor pattern that substantially surrounds an outer periphery of the electronic component when the laminate is viewed in a laminating direction, the first individual conductor pattern being arranged closer to the first external electrode than the second external electrode and the second individual conductor pattern being arranged closer to the second external electrode than the first external electrode; and at least one of the first individual conductor pattern and the second individual conductor pattern being arranged adjacent to a corner of the electronic component when viewed in the laminating direction;

wherein at least one of the first individual conductor pattern and second individual conductor pattern extends along two connecting sides of the electronic component that define the corner, viewed in the laminating direction.

11. The component-embedded substrate according to claim 10, wherein:
the first individual conductor pattern of the first layer is connected to the first individual conductor pattern of the second layer by a first connection conductor, and
the second individual conductor pattern of the first layer is connected to the second individual conductor pattern of the second layer by a second connection conductor.

12. The component-embedded substrate according to claim 10, wherein the frame-shaped conductor pattern of the first and second layers is arranged in a range in which the electronic component is arranged in the laminating direction.

13. The component-embedded substrate according to claim 10, wherein:
the first individual conductor pattern and second individual conductor pattern are arranged on each of the plurality of insulating layers;
two adjacent first individual conductor patterns in the laminating direction are partially overlapped each other, viewed in the laminating direction;
the two adjacent second individual conductor patterns in the laminating direction are partially overlapped each other, viewed in the laminating direction;
the two adjacent first individual conductor patterns are connected to each other by an interlayer connection conductor; and
the two adjacent second individual conductor patterns are connected to each other by an interlayer connection conductor.

14. The component-embedded substrate according to claim 10, wherein each of the first individual conductor patterns and second individual conductor pattern is arranged in a region of the plurality of insulating layers including insulating layers attached to an upper surface and a bottom surface of the electronic component.

15. A component-embedded substrate comprising:
a plurality of electronic components, each of the plurality of electronic components including a first external terminal electrode and a second external terminal electrode; and
a laminate obtained by stacking a plurality of layers and thermocompression bonding the plurality of layers in a state in which the plurality of electronic components are arranged in the plurality of layers,
wherein the plurality of layers comprises a first layer and a second layer stacked together, the first layer and the second layer each comprising:
an insulating layer made of thermoplastic resin, and
a first individual conductor pattern and a second individual conductor pattern provided on the insulating layer that form a frame-shaped conductor pattern that substantially surrounds an outer periphery of the plurality of electronic components when the laminate is viewed in a laminating direction,
the first individual conductor pattern being arranged closer to the first external electrode than the second external electrode of each of the plurality of electronic components, and the second individual conductor pattern being arranged closer to the second external electrode than the first external electrode of each of the plurality of electronic components, and
at least one of the first individual conductor pattern and the second individual conductor pattern being arranged adjacent to a corner of the electronic component when viewed in the laminating direction;
wherein at least one of the first individual conductor pattern and second individual conductor pattern extends along two connecting sides of the electronic component that define the corner, viewed in the laminating direction.

16. The component-embedded substrate according to claim 15, wherein an integrated individual conductor pattern corresponds to a group of external terminal electrodes having a same electric potential in the plurality of electronic components.

17. The component-embedded substrate according to claim 15, wherein:
the first individual conductor pattern and the second individual conductor pattern are arranged in a direction in which the first external terminal electrode and the second external terminal electrode are aligned, the first individual conductor pattern and the second individual conductor pattern being arranged such that a plurality of gaps is formed therebetween in an array direction in which the plurality of electronic components are arrayed; and
at least one gap of the plurality of gaps is arranged at a position different from positions of other gaps among the plurality of gaps in the direction in which the first external terminal electrode and the second external terminal electrode are aligned.

18. The component-embedded substrate according to claim 17, wherein a gap of the first layer is arranged at a position different from a position of a gap of the second layer in the direction in which the first external terminal electrode and the second external terminal electrode are aligned.

* * * * *